United States Patent
Chou et al.

(10) Patent No.: US 8,053,325 B1
(45) Date of Patent: Nov. 8, 2011

(54) BODY CONTACT STRUCTURES AND METHODS OF MANUFACTURING THE SAME

(75) Inventors: Anthony Chou, Hopewell Junction, NY (US); Arvind Kumar, Hopewell Junction, NY (US); Shreesh Narasimha, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/782,320

(22) Filed: May 18, 2010

(51) Int. Cl.
*H01L 21/336* (2006.01)
(52) U.S. Cl. ........................................ 438/306
(58) Field of Classification Search .................. None
See application file for complete search history.

(56) References Cited

U.S. PATENT DOCUMENTS

| | | | |
|---|---|---|---|
| 4,675,713 A * | 6/1987 | Terry et al. | 257/329 |
| 6,281,593 B1 | 8/2001 | Brown et al. | |
| 6,667,645 B1 | 12/2003 | Fletcher | |
| 6,753,574 B2 | 6/2004 | Yamaguchi et al. | |
| 7,129,543 B1 | 10/2006 | Maeda et al. | |
| 7,504,291 B2 | 3/2009 | Maeda et al. | |
| 2004/0070034 A1* | 4/2004 | Park et al. | 257/380 |
| 2005/0142781 A1* | 6/2005 | Chu et al. | 438/303 |
| 2008/0029805 A1* | 2/2008 | Shimamoto et al. | 257/315 |
| 2009/0221124 A1* | 9/2009 | Yamauchi | 438/306 |

OTHER PUBLICATIONS

Maeda, et al., "Analysis of Delay Time Instability According to . . . Isolated SOI Circuits", IEEE Transactions on Electron Devices, vol. 45, No. 7, Jul. 1998, pp. 1479-1486.

* cited by examiner

*Primary Examiner* — Walter L Lindsay, Jr.
*Assistant Examiner* — Andre' C Stevenson
(74) *Attorney, Agent, or Firm* — Joseph Petrokaitis; Roberts Mlotkowski Safran & Cole, P.C.

(57) ABSTRACT

A body contact structure which reduce parasitic capacitance and improves body resistance of a device and methods of manufacture. The method includes forming a gate insulator material and gate electrode material on a substrate. The method further includes patterning the gate insulator material and the gate electrode material to form a gate structure having a shape with a first portion isolated from a second portion. The method further includes forming source and drain regions on sides of the first portion and a body contact at a side and under an area of the second portion, and forming an interlevel dielectric within a space that isolates the first portion from the second portion of the gate structure, and over the gate structure, source and drain regions and the body contact.

26 Claims, 7 Drawing Sheets

BODY CONTACT STRUCTURES AND METHODS OF MANUFACTURING THE SAME

FIELD OF THE INVENTION

The invention relates to body contact structures and methods of manufacture, and more particularly, to Silicon-On-Insulator (SOI) body contact structures which reduce parasitic gate capacitance and improve body resistance of a device and methods of manufacture.

BACKGROUND

Silicon-On-Insulator (SOI) technology realizes lower power consumption and higher speed operation, compared to transistors formed in a bulk semiconductor layer. In SOI technology, the source, body, and drain regions of the transistor are insulated from the substrate, which reduces parasitic junction capacitances and eliminates latch-up. However, floating body effects can result when the body of each transistor is left unconnected. The floating body effect causes the transistor's body to "float" to a potential determined by the various leakage currents into the body. This varying body potential can cause adverse floating body effects such as, e.g., drain current "kink"-effect, lower breakdown voltage and lower drain output resistance, which is problematic for analog circuit applications.

In SOI Analog/Mixed/IO circuits, a body contact transistor can be used to eliminate the floating body effect in SOI technology. SOI transistors are formed in a silicon semiconductor layer (SOI) over a buried insulating layer. SOI transistors also include a body formed in the silicon semiconductor substrate and disposed beneath a gate region of the transistor. In a floating-body SOI FET, the body is not externally accessible. Body-contacted SOI transistors also include a body contact for connecting the body of the SOI transistor to a bias potential. For example, SOI transistors generally require connecting a p-type conductivity body, in the case of an n-channel MOSFET, or an n-type conductivity body, in the case of a p-channel MOSFET, to a bias potential.

One method of connecting the body of the SOI transistor to a bias potential is to provide an edge contact to the body using a T-shaped or H-shaped gate poly layout. However, T-shaped and H-shaped gate poly layouts add significant parasitic gate capacitance to the SOI transistor due to the portion of the poly layer not contributing to drive current of the transistor. Additionally, this type of body contact introduces a resistance between the external body contact and the internal body region, which limits the maximum frequency response of the body contact due to RC delay. The body contact also causes additional gate leakage because of the added polysilicon over gate dielectric. Also, as the SOI thickness is scaled down for high performance devices, increased body resistance may reduce the effectiveness of body contact.

Accordingly, there exists a need in the art to overcome the deficiencies and limitations described hereinabove.

SUMMARY

In first aspect of the invention, a method comprises forming a gate insulator material and gate electrode material on a substrate. The method further comprises patterning the gate insulator material and the gate electrode material to form a gate structure having a shape with a first portion isolated from a second portion. The method further comprises forming a spacer within a space that isolates the first portion from the second portion of the gate structure. The method further comprises forming source and drain regions on sides of the first portion and a body contact at a side and under an area of the second portion after formation of the spacer.

In another aspect of the invention, a method comprises forming a well in an underlying substrate. The method further comprises forming a gate insulator material and a gate electrode layer on the substrate. The method further comprises patterning the gate insulator material and the gate electrode material to form a continuous gate structure having a first portion substantially perpendicular to a second portion. The method further comprises forming spacers on sidewalls of the gate structure. The method further comprises forming source and drain regions on sides of the first portion and a body contact on a side of the second portion. The method further comprises forming a silicide on the gate, body contact region, source and drain regions. The method further comprises forming a space between the first portion and the second portion to isolate the first portion from the second portion. The forming is a different step than the patterning of the first portion and the second portion. The method further comprises filling the space with an interlevel dielectric material.

In yet another aspect of the invention, a structure comprises an underlying substrate having a well and a gate structure having a space isolating a first portion from a substantially perpendicular second portion. The second portion overlaps the well and a body contact region. Spacers are on sidewalls of the gate structure. Source and drain regions are on sides of the first portion. Interlevel dielectric material fills the space and over the gate structure, source and drain regions and the body contact.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to body contact structures and methods of manufacture, and more particularly, to body contact structures which reduce parasitic capacitance and improve body resistance of a device and methods of manufacture. Advantageously, the present invention reduces parasitic capacitance of the gate structure, while improving body resistance and reducing gate leakage. The present invention will also improve the frequency response of the body-contact FET.

In embodiments, the parasitic gate capacitance of the device can be eliminated by detaching a parasitic (contact) bridge from the FET gate in a gate contact structure. The contact bridge can be detached from the FET gate by an etching process during, for example, patterning of the gate structure or after silicide formation. In either case, in embodiments, the contact bridge is further isolated from the FET gate by an insulating material such as, for example, an interlevel dielectric or a spacer material. Also, the present invention provides a terminal to the contact bridge to bias the contact bridge independently from the FET gate structure which, in turn, reduces body resistance and avoids depletion of the body contact region underneath. As such, by implementing the present invention, it is possible to provide high performance (analog) devices.

Figure 1:
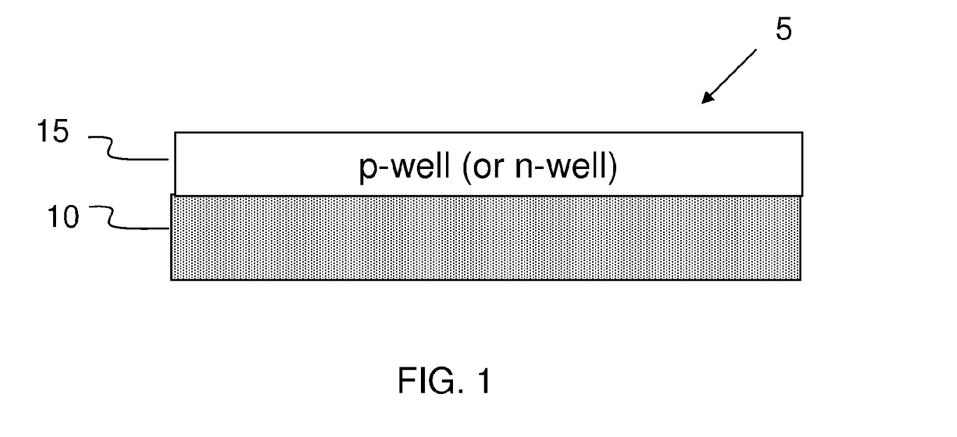
FIG. 1 shows a beginning structure in accordance with aspects of the invention.

FIG. 1 shows a beginning structure in accordance with aspects of the invention. In particular, the beginning structure 5 includes a substrate 15 on an insulator layer 10. In embodiments, the substrate 15 can be an SOI substrate bonded to an insulator layer 10 such as, for example, BOX oxide.

As should be understood by those of skill in the art, the SOI substrate is a substrate having a thin semiconductor layer formed on an insulation layer. Amongst other benefits, devices formed on the semiconductor layer are isolated from the substrate by the insulation layer, with advantageous results of, for example, immunity to latch-up and reduced junction capacitance. The SOI substrate is suitable for semiconductor devices requiring high speed operations.

A p-well or n-well is formed in the substrate 15, depending on the type of dopant used to form the well. For example, a p-well used in an NFET device can be formed with a boron implant; whereas, an n-well used in a PFET device can be, for example, formed with an arsenic, phosphorous or antimony implant. As such, it should be understood by those of skill in the art that the present invention can be implemented as either a PFET or an NFET.

Figure 2:
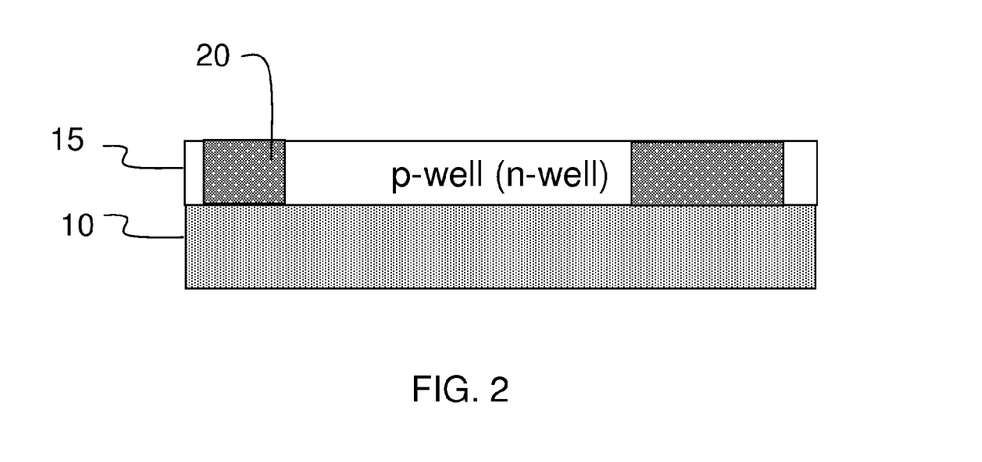
FIGS. 2-7 show additional structures and related processing steps in accordance with aspects of the invention.

FIG. 2 shows the formation isolation structures 20 formed in the substrate 15. The isolation structures 20 can be formed using conventional processes. For example, the isolation structures 20 can be shallow trench isolation (STI) structures formed by conventional lithographic, etching (e.g., RIE) and deposition processes. As an illustrative example, a photoresist (not shown) can be formed over the substrate 15, where openings are formed by exposure to light. After the openings are formed, an etching process forms trenches in the substrate 15. The trenches can be filled with oxide or other insulator material and planarized by chemical mechanical polishing (CMP) to form shallow trench isolation structures.

Figure 3:
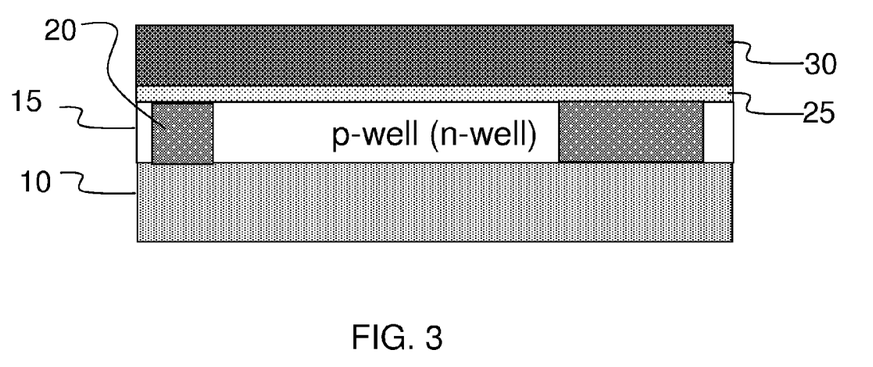

FIG. 3 shows the formation of a gate insulator material 25 and gate electrode material 30 on the substrate 15. In embodiments, the gate insulator material 25 can be any known gate insulator material such as, for example, $SiO_2$, SiON, $Al2O_3$, $HfO_2$, $AlO_2$, Hafnium silicate, or any high-k dielectric material. The gate insulator material 25 can be deposited or thermally grown, depending on the type of material used for the gate insulator. In further embodiments, the gate insulator material 25 can be a stacked structure of one or more combinations of insulator materials. In embodiments, the gate insulator material 25 can be deposited using conventional deposition methods such as, for example, CVD, PVD, etc. In further embodiments, the gate insulator material 25 can be formed to a thickness of about 10 Å to about 50 Å; although other dimensions are contemplated by the invention depending on the desired device performance.

The gate electrode material 30 can be a metal gate material or doped polysilicon material or various stacked combinations of these materials. The metal material can be, for example, any known metal used to form a gate electrode. As an illustrative, non-limiting example, the metal gate can be aluminum, TiN or tungsten, or other metals or metal alloys. In embodiments, the gate electrode material 30 can be formed using a conventional deposition or sputtering technique.

Figure 4:
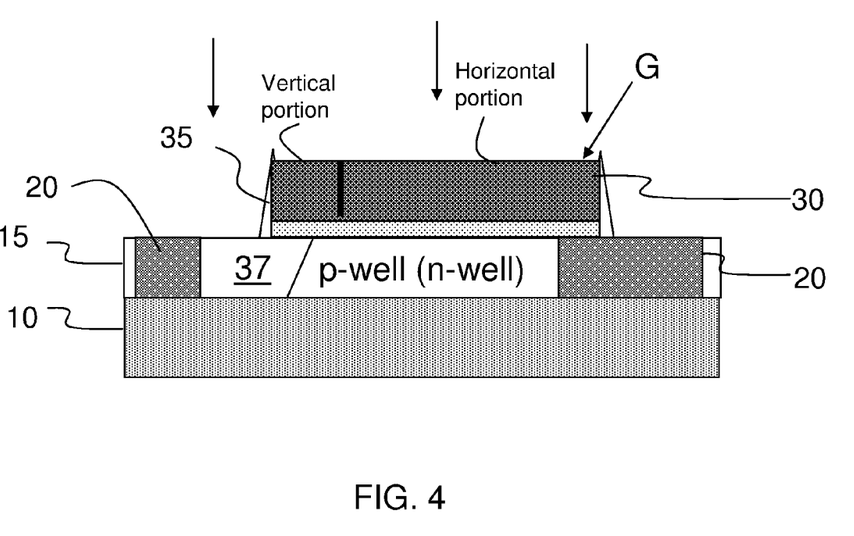

FIG. 4 shows additional processing steps in accordance with the invention. In particular, FIG. 4 shows a patterning of the gate insulator material 25 and gate electrode material 30 to form a gate structure "G". The patterning can be any conventional patterning processes such as, for example, lithographic and reactive ion etching (RIE) processes. In embodiments, the gate structure "G" is patterned in a "T" shape (see, e.g., FIG. 6b); although other shapes, e.g., "H" shape structure, are also contemplated by the present invention. In embodiments, a first portion (e.g., horizontal portion) of the "T" shape gate structure "G" acts as the FET gate; whereas, the second portion (e.g., vertical portion) of the "T" shape gate structure "G" acts as a contact bridge under which an electrical connection is made between an implanted body contact in the substrate 15 and the well (e.g., p-well). The vertical portion is sometimes referred to as a bridge gate, which is perpendicular or substantially perpendicular to the gate. In this way, it should be understood that the second portion (e.g., vertical portion) of the "T" shape gate structure "G" is aligned with (i.e., overlaps) both the implanted body contact in the substrate 15 and the well (e.g., p-well).

FIG. 4 also shows the formation of spacers 35 on sidewalls of the "T" shape gate structure "G". The spacers 35 can be, for example, deposited nitride or oxide. FIG. 4 also shows the formation of source and drain regions. In particular, the structure of FIG. 4 undergoes conventional source and drain implantation processes to form the source and drain regions on sides of the first portion (e.g., horizontal portion) of the "T" shape gate structure "G" (see, e.g., FIG. 6b), using standard photolithograpy patterning to define the implant areas. In an NFET example, the structure undergoes a source/drain implantation process using conventional n-type dopants (e.g., arsenic or phosphorous). In a PFET example, the structure undergoes a source/drain implantation process using conventional p-type dopants (e.g., boron or $BF_2$) (in which case the well is an n-well). In embodiments, the source and drain region can also undergo a conventional halo and extension implantation to improve short-channel characteristics. These halo and extension implants are performed earlier in the process flow, e.g., prior to spacer formation and the source and drain implants.

A body contact portion 37 is implanted in the substrate 15, adjacent (and in electrical contact) to the well and the second portion (e.g., vertical portion) of the "T" shape gate structure "G". In embodiments, the body contact portion 37 is formed by implanting appropriate dopant types into the substrate to connect to the well region underneath the gate. For example, in an NFET, the body contact dopants would be a p+ dopants to connect to the p-well; whereas, in a PFET, the body contact dopants would be n+ dopants to connect to the n-well. In embodiments, the dopants can be implanted at an angle in order to ensure a sufficient diffusion of dopants under the second portion (e.g., vertical portion) of the "T" shape gate structure "G". As should be understood by those of ordinary skill in the art, the second portion (e.g., vertical portion) of the "T" shape gate structure "G" in combination with a patterned photoresist layer opening the body contact region will block the body contact dopants from being implanted into the source and drain regions. The vertical portion of the "T" shape gate structure needs to be wide enough such that the appropriate edge of the photoresist opening lands on this vertical portion, even in the presence of lithography alignment tolerance.

Figure 5:
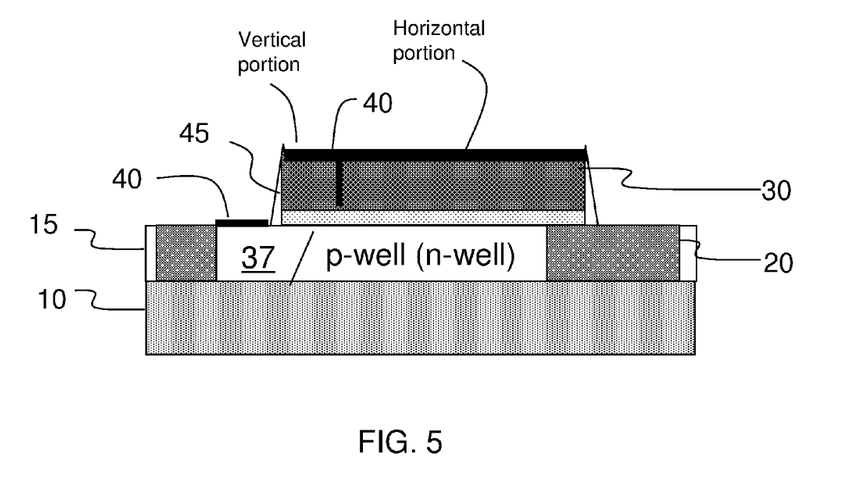

FIG. 5 shows a silicide process in accordance with the invention. In this embodiment, a metal such as Ni, Ti, or Co is deposited on top and the structure is subjected to a heated environment (e.g., about 500° C. or higher) in order to form silicide 40 on a top portion of the gate structure "G", as well as over the body contact 37, e.g., exposed portions of the structure, and source and drain regions. As should be understood by those of skill in the art, the spacers 45 will prevent formation of silicide on sides of the "T" shape gate structure "G" (or other blocked areas), thus avoiding silicide connection between the source, drain, gate and body regions.

Figure 6A:
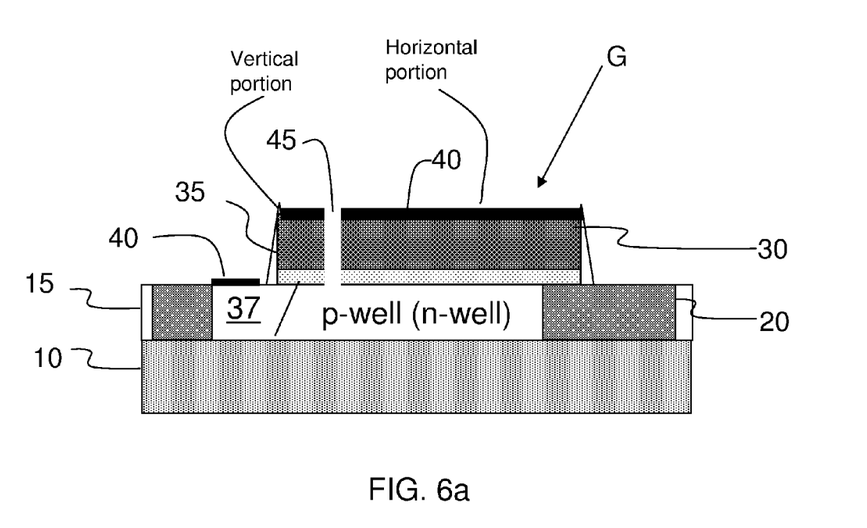

In FIG. 6a, the gate structure "G" undergoes an etching process to form an isolation space 45 between the first portion (e.g., horizontal portion) and second portion (e.g., vertical portion) of the "T" shape gate structure "G". In this way, the isolation space 45 provides a decoupling of the first portion (e.g., horizontal portion) and second portion (e.g., vertical portion) of the "T" shape gate structure "G". This decoupling provides many benefits to the device performance. For example, the decoupling eliminates the parasitic capacitance and gate leakage of the vertical portion of the FET gate structure "G" (that would otherwise occur in a coupled structure). By eliminating the parasitic capacitance of the vertical portion of the gate, this improves frequency response of the body contact 37 by reducing the RC delay (the capacitance component). Additionally, by detaching of the second portion (e.g., vertical portion) from the first portion (e.g., horizontal portion), it is now possible to provide a separate terminal to the second portion (e.g., vertical portion). The separate terminal allows biasing of the device to accumulate charge in the semiconductor region underneath the gate which reduces body contact resistance, and reduces the RC delay (the resistance component). Also, the present invention creates a separate terminal for the vertical gate which can be biased to accumulation to prevent depletion under inversion gate bias that normally occurs for a fully connected gate structure, thus ensuring that the body remains in contact. A conventional "T" gate which has a connected horizontal and vertical gate often depletes in the region underneath the vertical part of the gate, which causes failure of the body contact that results in cutting off the body which results in a floating body.

Figure 6B:
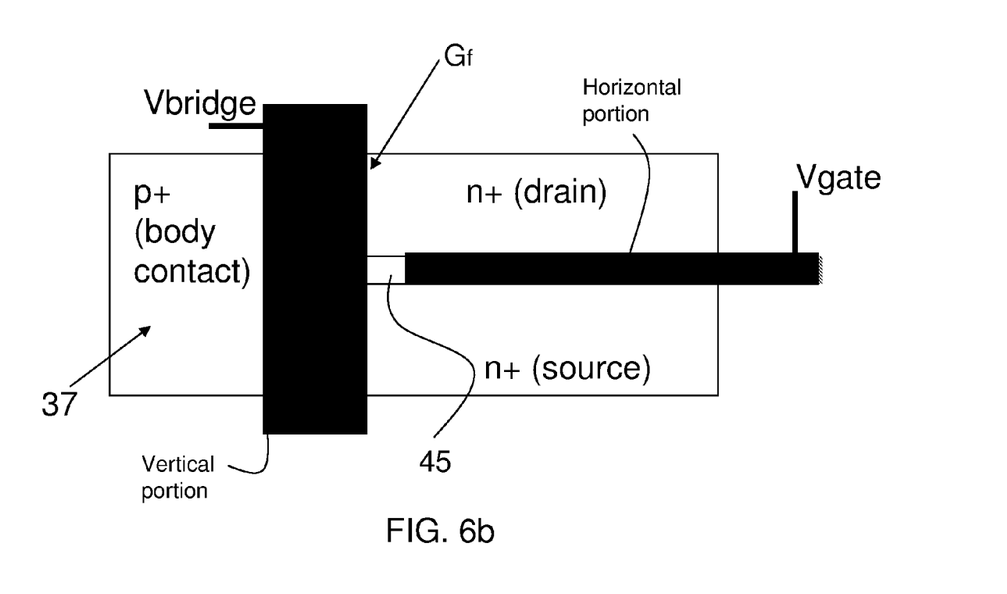

FIG. 6b shows a top portion of the structure shown in FIG. 6a. As seen in FIG. 6b, the body contact 37 is formed on a side (and underneath) of the second portion (e.g., vertical portion) of the "T" shape gate structure "G". Also, the source and drain regions are formed on sides of the first portion (e.g., horizontal portion) of the "T" shape gate structure "G". The isolation space 45 isolates (decouples) the first portion (e.g., horizontal portion) of the "T" shape gate structure "G" from the second portion (e.g., vertical portion) of the "T" shape gate structure "G".

Figure 7:
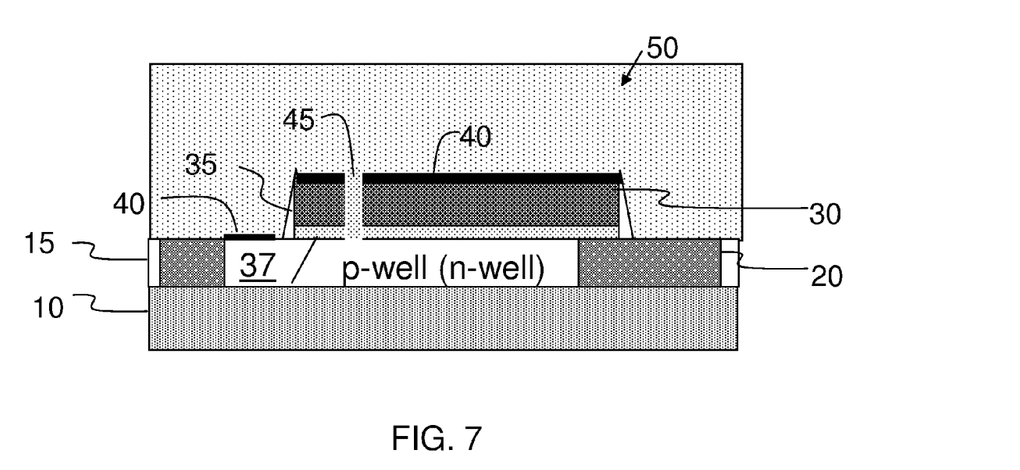

As further shown in FIG. 6b, a terminal "Vbridge" connects to the second portion (e.g., vertical portion) of the "T" shape gate structure "G", and a terminal "Vgate" connects to the first portion (e.g., horizontal portion) of the "T" shape gate structure "G". The "Vbridge" terminal provides an extra degree of freedom to bias the second portion (e.g., vertical portion) of the "T" shape gate structure "G" thereby reducing body resistance by accumulating the region underneath. This is an advantage over a conventional gate structure, where both the horizontal and vertical gates are connected together and when the gate terminal is biased to invert the channel (turning the FET on), the body region underneath the vertical gate tends to deplete which increases the body resistance In FIG. 7, an interlevel dielectric 50 is deposited on the structure of FIG. 6a (or FIG. 6b). The interlevel dielectric 50 can be blanket deposited over the structure using any known insulator material. In embodiments, the interlevel dielectric 50 is deposited in the isolation space to further insulate or isolate (decouple) the first portion (e.g., horizontal portion) of the "T" shape gate structure "G" from the second portion (e.g., vertical portion) of the "T" shape gate structure "G". Although not shown, vias can be formed in the interlevel dielectric 50, exposing portions of the source, drain and gate structure "G". Contacts can be formed in the vias, contacting to the source, drain, body and both horizontal and vertical gate structures. The contacts can be metal such as, for example, tungsten. In embodiments, the contacts will connect to an upper wiring layer made of copper, aluminum or other metals.

Figure 8:
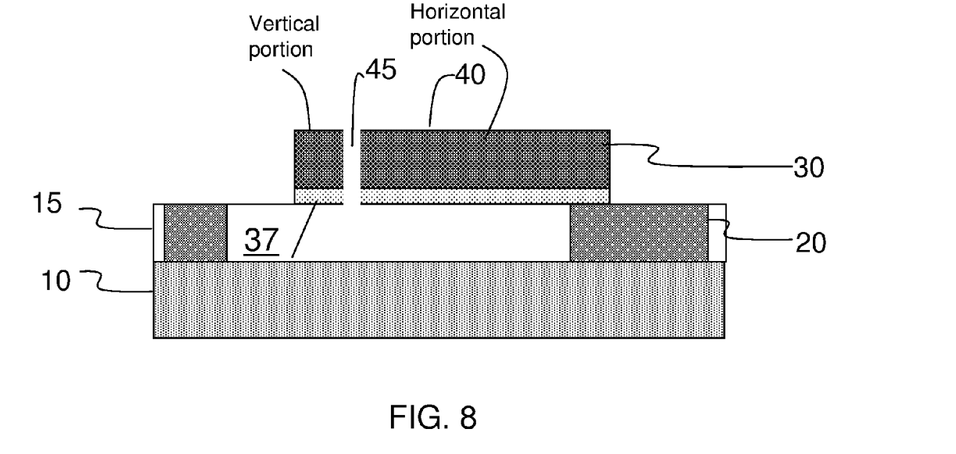
FIGS. 8-11 show alternative structures and respective processing steps in accordance with aspects of the invention.

FIGS. 8-11 show alternative structures and respective processing steps in accordance with aspects of the invention. In FIG. 8, the gate insulator material 25 and gate electrode material 30 are patterned to form the gate structure "G". As in the embodiment discussed above, the gate structure "G", in embodiments, is a "T" shape (see, e.g., FIG. 6b); although other shapes are also contemplated by the present invention. In embodiments, the first portion (e.g., horizontal portion) of the "T" shape gate structure "G" acts as the gate; whereas, the second portion (e.g., vertical portion) of the "T" shape gate structure "G" acts as a contact bridge making electrical contact to the implanted body contact in the substrate 15 and the well (e.g., p-well).

During the gate patterning process, the isolation space 45 is also patterned to decouple the first portion (e.g., horizontal portion) from the second portion (e.g., vertical portion) of the "T" shape gate structure "G". In this embodiment, the isolation space 45 is a minimum dimension (e.g., about 2× a thickness of a spacer wall). In this way, the isolation space 45 can be completely (or substantially completely) filled with a spacer material during spacer formation and the underlying substrate will be fully covered/protected.

Figure 9:
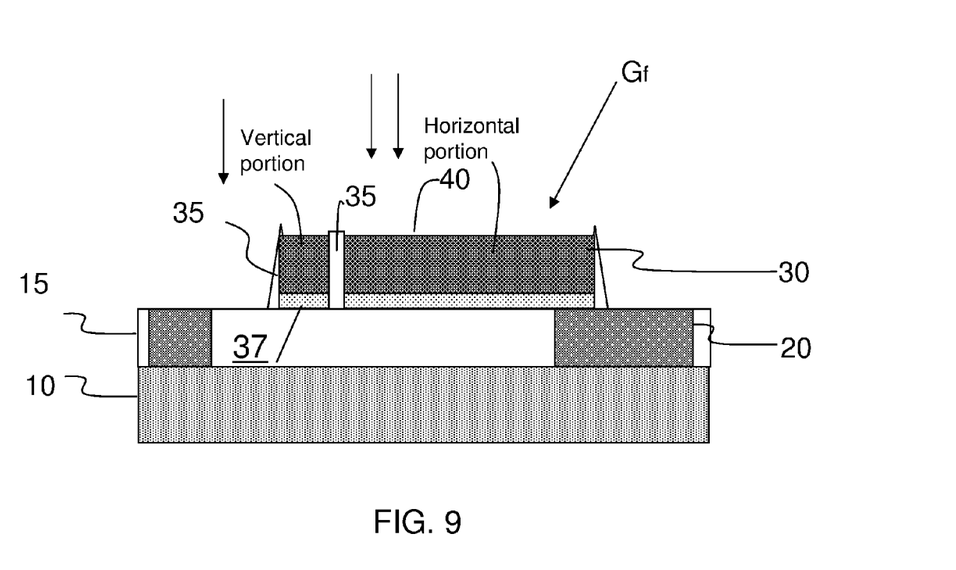

In FIG. 9, spacers 35 deposited onto sidewalls of the "T" shape gate structure "G", and in the isolation space 45. The spacer material, e.g., nitride, will "pinch off" the isolation space 45, effectively closing it with insulator material. In this way, the insulator material (spacer material) will further isolate or decouple the second portion (e.g., vertical portion) from the first portion (e.g., horizontal portion). The spacer material can be, for example, nitride or oxide.

The structure of FIG. 9 further undergoes source and drain implantation processes to form the source and drain regions on sides of the first portion (e.g., horizontal portion) of the "T" shape gate structure "G". As in the previous embodiment, in the NFET example, the structure undergoes an implant process using conventional n-type dopants. Of course, p-type dopants can be used when forming a PFET (in which case the well will be an n-well). In embodiments, the source and drain region can undergo a conventional halo implantation process to reduce device resistance.

A body contact portion 37 is formed in the substrate 15, adjacent (and in electrical contact) to the well and under the second portion (e.g., vertical portion) of the "T" shape gate structure "G". In embodiments, the second portion (e.g., vertical portion) of the "T" shape gate structure "G" blocks the body contact dopants from implanting into the source and drain regions. Also, the second portion (e.g., vertical portion) of the "T" shape gate structure "G" is of such a dimension as to span between the body contact portion 37 and the well (p-well or n-well). In the case of an NFET, the body contact is formed by implanting a p+ type dopant; whereas, an n+ dopant is implanted for a PFET type device. It should be understood that during implantation processes, locations that are not to be implanted may be blocked using a patterned photoresist to prevent implantation of the dopant.

Figure 10:
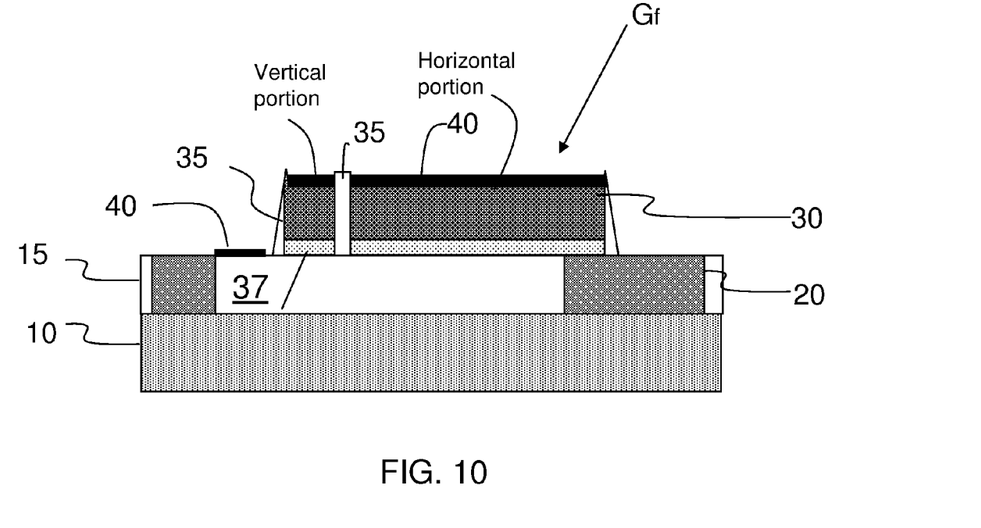

FIG. 10 shows a silicide process in accordance with the invention. In this embodiment, a metal such as Ni, Ti, or Co is deposited on top and the structure is subjected to a heated environment (e.g., about 500° C. or higher) in order to form silicide 40 on a top portion of the gate structure "G", as well as over the body contact 37, e.g., exposed portions of the structure, and source and drain regions. As should be understood by those of skill in the art, the spacers 35 will prevent formation of silicide on sides of the "T" shape gate structure "G" (or other blocked areas), thus avoiding silicide connection between the source, drain, gate and body regions. The silicide will not form on the spacer material, as should be understood by those of skill in the art.

Similar to above, a terminal "Vbridge" connects to the second portion (e.g., vertical portion) of the "T" shape gate structure "G", and a terminal "Vgate" connects to the first portion (e.g., horizontal portion) of the "T" shape gate structure "G". The "Vbridge" terminal provides an extra degree of freedom to bias the second portion (e.g., vertical portion) of the "T" shape gate structure "G" to accumulate carriers in the region beneath, thereby reducing body resistance and improving the frequency response of the body contact.

Figure 11:
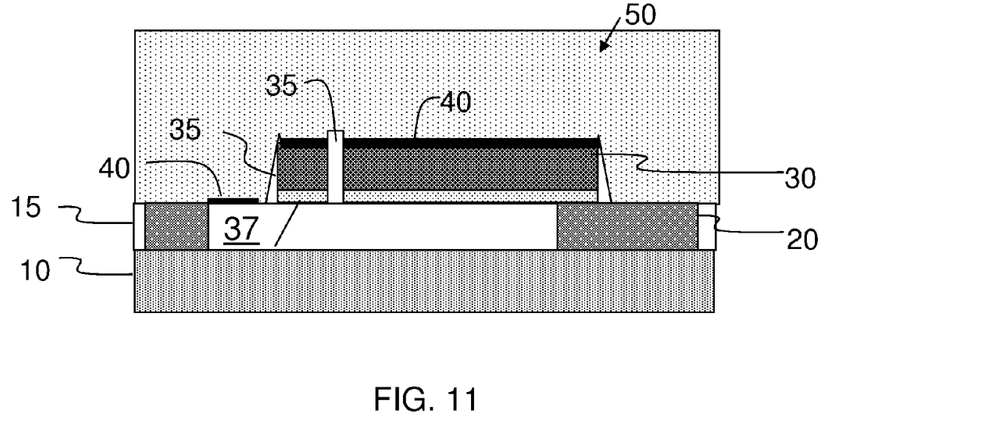

In FIG. 11, an interlevel dielectric 50 is deposited on the structure of FIG. 6a (or FIG. 6b). The interlevel dielectric 50 can be blanket deposited over the structure using any known insulator material. In embodiments, although not shown, vias can be formed in the interlevel dielectric 50, exposing portions of the source, drain and gate structure "G". Contacts can be formed in the vias, contacting to the source, drain, body and both horizontal and vertical gate structures. The contacts can be metal such as, for example, tungsten. In embodiments, the contacts will connect to an upper wiring layer. It should be understood that while a gate-first integration flow is described here, a similar structure can be achieved using a gate-last or replacement gate integration flow.

Design Structure

Figure 12:
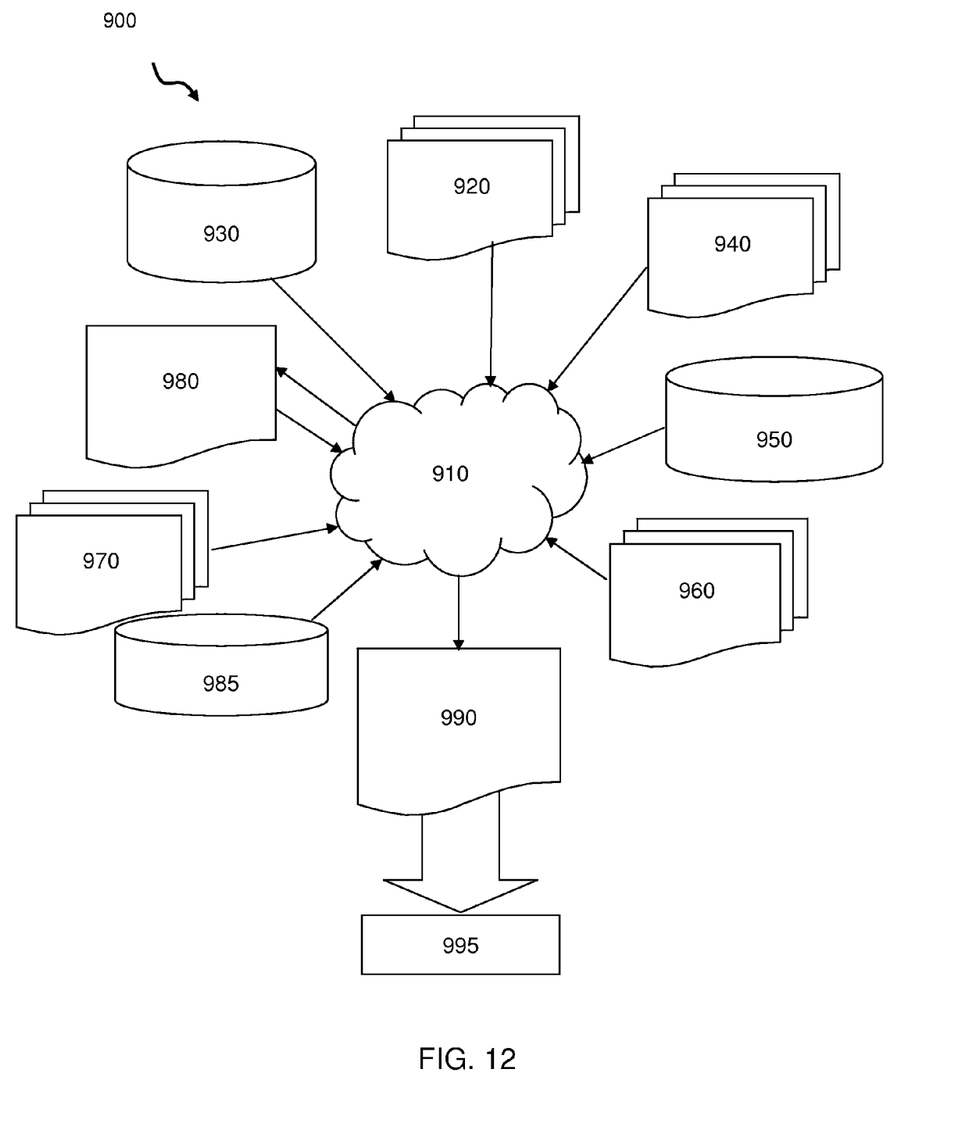
FIG. 12 is a flow diagram of a design process used in semiconductor design, manufacture, and/or test.

FIG. 12 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 1-11 in the form of schematics or HDL, a hardware-description language (e.g., Verilog, VHDL, C, etc.). Design structure 920 may be contained on one or more machine-readable media. For example, design structure 920 may be a text file or a graphical representation of an embodiment of the invention as shown in FIGS. 1-11. Design process 910 preferably synthesizes (or translates) embodiments of the invention as shown in FIGS. FIGS. 1-11 into a net list 980, where net list 980 is, for example, a list of wires, transistors, logic gates, control circuits, I/O, models, etc. that describes the connections to other elements and circuits in an integrated circuit design and recorded on at least one of machine readable media. For example, the medium may be a CD, a compact flash, other flash memory, a packet of data to be sent via the Internet, or other networking suitable means. The synthesis may be an iterative process in which net list 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 1-11, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce embodiments of the invention as shown in FIGS. 1-11. Design structure 990 may then proceed to a stage 995 where, for example, design structure 990: proceeds to tape-out, is released to manufacturing, is released to a mask house, is sent to another design house, is sent back to the customer, etc.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method comprising:
forming a gate insulator material and gate electrode material on a substrate;
patterning the gate insulator material and the gate electrode material to form a gate structure having a shape with a first portion and a second portion, the first portion and the second portion comprising a respective portion of the gate insulator material and the gate electrode material;
forming a space between the first portion and the second portion to isolate the first portion from the second portion;
forming a spacer within the space that isolates the first portion from the second portion of the gate structure; and
forming source and drain regions on sides of the first portion and a body contact at a side and under an area of the second portion after formation of the spacer.

2. The method of claim 1, wherein the patterning comprises forming the space between the first portion and the second portion in a separate etching step from forming the shape of the gate structure.

3. The method of claim 2, wherein the separate etching step includes etching into a silicide and the gate electrode material, to the underlying substrate.

4. The method of claim 3, wherein the space is etched after an annealing process is performed on the source and drain regions, the body contact and the gate structure after silicide formation.

5. The method of claim 1, wherein the shape includes forming a "T" shaped structure which is formed prior to forming the space.

6. The method of claim 5, wherein the first portion is a gate and the second portion is a dummy gate.

7. The method of claim 6, wherein the dummy gate overlaps the body contact and a well.

8. The method of claim 1, further comprising forming spacers on sidewalls of the gate structure prior to forming the space.

9. The method of claim 8, wherein the spacers are formed prior to annealing of the source and drain regions.

10. A method comprising:
forming a well in an underlying substrate;
forming a gate insulator material and a gate electrode layer on the substrate;
patterning the gate insulator material and the gate electrode material to form a continuous gate structure having a first portion substantially perpendicular to a second portion;
forming spacers on sidewalls of the gate structure;
forming source and drain regions on sides of the first portion and a body contact on a side of the second portion;
forming a silicide on the gate structure, the body contact, and the source and the drain regions;
forming a space between the first portion and the second portion to isolate the first portion from the second portion, wherein the forming is a different step than the patterning of the first portion and the second portion; and
filling the space with an interlevel dielectric material.

11. The method of claim 10, wherein the space is created after the formation of the source and drain regions.

12. The method claim 11, wherein the space is formed after the formation of the body contact.

13. The method of claim 12, wherein the space is formed after the spacers are formed on sidewalls of the gate structure.

14. The method of claim 13, wherein the space is formed after sidewall spacer formation, source and drain region implanting and annealing of the source and drain regions, an implant of the body contact and the gate structure, and silicide formation.

15. The method of claim 14, wherein the interlevel dielectric is deposited over the entire gate structure, including the source and drain regions and the body contact.

16. The method of claim 10, wherein the space is formed in a separate etching step from forming of the gate structure.

17. The method of claim 10, wherein the gate structure is includes a T shape, and the second portion of the T shape is a vertical or bridge portion which overlaps the body contact and the well.

18. The method of claim 10, further comprising annealing the gate structure prior to the forming of the space.

19. A structure comprising:
an underlying substrate having a well of a first conductivity-type;
a gate structure having a space isolating a first portion from a substantially perpendicular second portion, the second portion overlapping and in physical contact with the well and a body contact region of a second conductivity-type, the body contact region implanted in the well;
spacers on sidewalls of the gate structure;
source and drain regions of a third conductivity-type, on sides of the first portion, and in physical contact with the well; and
interlevel dielectric material filled within the space and over the gate structure, source and drain regions and the body contact region.

20. The structure of claim 19, further comprising a silicide on the gate structure, the source and drain regions and the body contact.

21. The method of claim 2, wherein the spacer comprises an interlevel dielectric material.

22. The structure of claim 19, wherein:
the first conductivity-type comprises a p-type;
the second conductivity-type comprises a p+-type; and
the third conductivity-type comprises a n-type.

23. The structure of claim 22, further comprising:
a first terminal formed in contact with the first portion; and
a second terminal formed in contact with the second portion,
wherein:
the gate structure comprises a T shape;
the first portion comprises a horizontal or gate portion of the T shape gate structure; and
the second portion comprises a vertical or contact bridge portion of the T shape gate structure.

24. The structure of claim 23, further comprising at least one isolation structure formed in the substrate, at a side of the gate structure, and in physical contact with one of the well and the body contact region.

25. The structure of claim 19, wherein:
the first conductivity-type comprises a n-type;
the second conductivity-type comprises a n+-type; and
the third conductivity-type comprises a p-type.

26. A method comprising:
forming a gate insulator material and gate electrode material on a substrate comprising a well;

patterning the gate insulator material and the gate electrode material to form a gate structure having a shape with a vertical portion isolated from a horizontal portion;

forming a spacer within a space that isolates the vertical portion from the horizontal portion of the gate structure; and forming source and drain regions on sides of the horizontal portion, and a body contact at a side and under an area of the vertical portion after formation of the spacer.

* * * * *